United States Patent
Chen et al.

(10) Patent No.: US 10,468,513 B1
(45) Date of Patent: Nov. 5, 2019

(54) BIDIRECTIONAL SILICON-CONTROLLED RECTIFIER

(71) Applicant: AMAZING MICROELECTRONIC CORP., New Taipei (TW)

(72) Inventors: Chih-Wei Chen, Taoyuan (TW); Kun-Hsien Lin, Hsinchu (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/117,147

(22) Filed: Aug. 30, 2018

(51) Int. Cl.
  *H01L 29/747* (2006.01)
  *H01L 29/06* (2006.01)
  *H01L 27/02* (2006.01)

(52) U.S. Cl.
  CPC ........ *H01L 29/747* (2013.01); *H01L 27/0248* (2013.01); *H01L 29/0607* (2013.01)

(58) Field of Classification Search
  CPC .............. H01L 29/747; H01L 27/0248; H01L 29/0607
  See application file for complete search history.

(56) References Cited

U.S. PATENT DOCUMENTS

| | | |
|---|---|---|
| 6,960,792 B1 | 11/2005 | Nguyen |
| 7,786,507 B2 | 8/2010 | Denison et al. |
| 7,873,386 B2 | 1/2011 | Bridgelall |
| 8,760,831 B2 | 6/2014 | Abou-Khalil et al. |
| 2009/0032838 A1 | 2/2009 | Tseng et al. |
| 2009/0273006 A1 | 11/2009 | Chen et al. |
| 2011/0068366 A1 | 3/2011 | Huang |

*Primary Examiner* — Anthony Ho
(74) *Attorney, Agent, or Firm* — Rosenberg, Klein & Lee

(57) ABSTRACT

A bidirectional silicon-controlled rectifier includes a lightly-doped semiconductor structure, a first lightly-doped region, a second lightly-doped region, a first doped well, a second doped well, a first heavily-doped area, a second heavily-doped area, a third heavily-doped area, a fourth heavily-doped area. The lightly-doped semiconductor structure, the first heavily-doped area, and the third heavily-doped area have a first conductivity type. The first lightly-doped region, the second lightly-doped region, the first doped well, the second doped well, the fourth heavily-doped area, and the second heavily-doped area have a second conductivity type. A first part of the first lightly-doped region is arranged under the first doped well. A second part of the second lightly-doped region is arranged under the second doped well.

12 Claims, 5 Drawing Sheets

BIDIRECTIONAL SILICON-CONTROLLED RECTIFIER

BACKGROUND OF THE INVENTION

Field of the Invention

The present invention relates to a bidirectional silicon-controlled rectifier, particularly to a bidirectional silicon-controlled rectifier that reduces a junction capacitance.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages. The working principle of TVS is shown in FIG. 1. In FIG. 1, the TVS device 10 is connected in parallel with the protected circuit 12 on the printed circuit board (PCB). The TVS device 10 would be triggered immediately when the ESD event occurs. In that way, the TVS device 10 can provide a superiorly low resistance path for discharging the transient ESD current, so that the energy of the ESD transient current can be bypassed by the TVS device 10.

In US patent application No. 20090032838, a symmetric bidirectional silicon-controlled rectifier includes a substrate, a buried layer, a first well, a middle region, a second well, a first semiconductor area, a second semiconductor area, a third semiconductor area, a fourth semiconductor area, a fifth semiconductor area, and a sixth semiconductor area. The buried layer is formed on the substrate. The first well, the middle region and the second well are sequentially formed on the buried layer side-by-side. The first semiconductor area and the second semiconductor area are both formed inside the first well. The third semiconductor area is formed in a junction between the first well and the middle region, wherein a first gate is formed over a region between the second and third semiconductor areas. The fourth semiconductor area and the fifth semiconductor area are both formed inside the second well. The sixth semiconductor area is formed in a junction between the second well and the middle region, wherein a second gate is formed over a region between the fifth and sixth semiconductor areas. The first well, the second well, and the substrate belong to the same conductivity type, and the substrate and the buried layer belong to different conductivity types. As a result, the junction capacitance between the well and the substrate cannot be reduced. Thus, the symmetric bidirectional silicon-controlled rectifier cannot be used for high-speed application.

To overcome the abovementioned problems, the present invention provides a bidirectional silicon-controlled rectifier, so as to solve the afore-mentioned problems of the prior art.

SUMMARY OF THE INVENTION

The primary objective of the present invention is to provide a bidirectional silicon-controlled rectifier, which forms a lightly-doped region under a doped well to reduce a junction capacitance, thereby applying to high-speed components.

To achieve the abovementioned objectives, the present invention provides a bidirectional silicon-controlled rectifier, which comprises a lightly-doped semiconductor structure, a first lightly-doped region, a first doped well, a first heavily-doped area, and a second heavily-doped area. The lightly-doped semiconductor structure has a first conductivity type. The first lightly-doped region has a second conductivity type and is formed in the lightly-doped structure. The first doped well has the second conductivity type and is formed in the first lightly-doped region, and a first part of the first lightly-doped region is arranged under the first doped well. The first heavily-doped area has the first conductivity type and is formed in the first doped well. The second heavily-doped area has the second conductivity type and is formed in the lightly-doped semiconductor structure. The bidirectional silicon-controlled rectifier further comprises a second lightly-doped region, a second doped well, a third heavily-doped area, and a fourth heavily-doped area. The second lightly-doped region has the second conductivity type and is formed in the lightly-doped structure. The second doped well has the second conductivity type and is formed in the second lightly-doped region. The second heavily-doped area is formed in the second doped well, and a second part of the second lightly-doped region is arranged under the second doped well. The third heavily-doped area has the first conductivity type and is formed in the second doped well. The fourth heavily-doped area has the second conductivity type and is formed in the first doped well.

In an embodiment of the present invention, the first part of the first lightly-doped region and the second part of the second lightly-doped region are respectively used as a first lightly-doped buried area and a second lightly-doped buried area.

In an embodiment of the present invention, the lightly-doped semiconductor structure further comprises a lightly-doped substrate having the first conductivity type and a lightly-doped epitaxial layer having the first conductivity type and formed on the lightly-doped substrate. The first lightly-doped buried area and the second lightly-doped buried area are formed in the lightly-doped substrate, and the first doped well and the second doped well are formed in the lightly-doped epitaxial layer.

In an embodiment of the present invention, the bidirectional silicon-controlled rectifier further comprises a third doped well having the first conductivity type and formed in the lightly-doped epitaxial layer, and the depth of the third doped well is equal to or deeper than the depths of the first heavily-doped area, the second heavily-doped area, the third heavily-doped area, and the fourth heavily-doped area.

In an embodiment of the present invention, the third doped well contacts the lightly-doped substrate.

In an embodiment of the present invention, the lightly-doped semiconductor structure is a lightly-doped semiconductor substrate, and the first lightly-doped region and the second lightly-doped region are lightly-doped wells. The first lightly-doped region surrounds the first doped well and the second lightly-doped region surrounds the second doped well.

In an embodiment of the present invention, the bidirectional silicon-controlled rectifier further comprises a third doped well having the first conductivity type and formed in the lightly-doped substrate, and a depth of the third doped well is equal to or deeper than depths of the first heavily-doped area, the second heavily-doped area, the third heavily-doped area, and the fourth heavily-doped area.

In an embodiment of the present invention, the depth of the third doped well is equal to a depth of each of the first doped well and the second doped well.

Below, the embodiments are described in detail in cooperation with the drawings to make easily understood the technical contents, characteristics and accomplishments of the present invention.

DETAILED DESCRIPTION OF THE INVENTION

Figure 1:
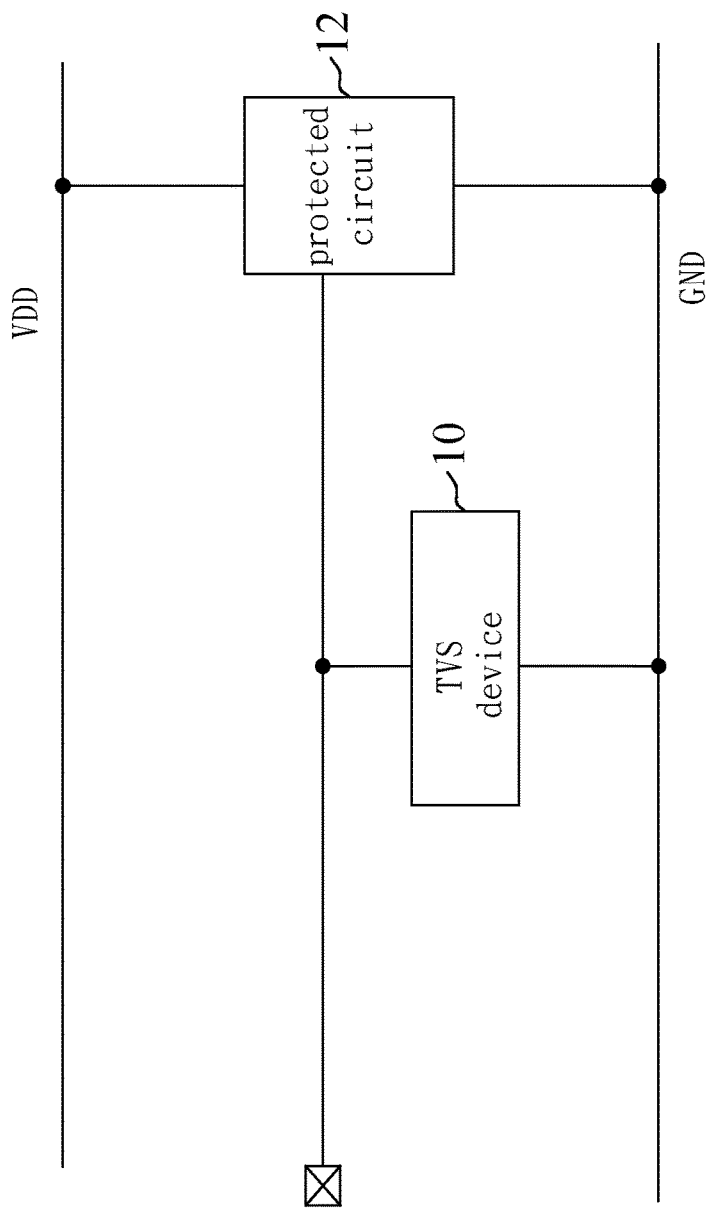
FIG. 1 is a schematic diagram illustrating a transient voltage suppressor (TVS) connected with a protected circuit in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 2:
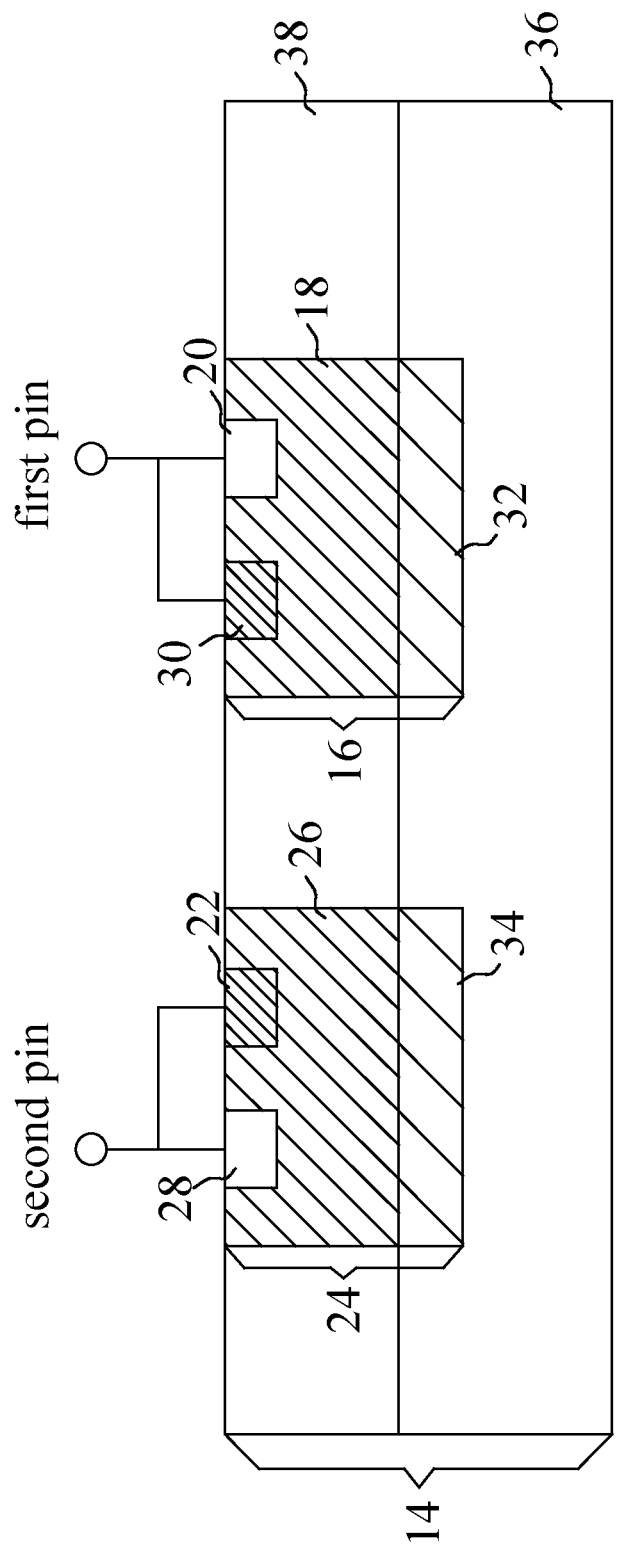
FIG. 2 is a cross-sectional view of a bidirectional silicon-controlled rectifier according to the first embodiment of the present invention.

Refer to FIG. 2. The first embodiment of the bidirectional silicon-controlled rectifier of the present invention is introduced as follows. The first embodiment is symmetrical. The bidirectional silicon-controlled rectifier comprises a lightly-doped semiconductor structure 14, a first lightly-doped region 16, a first doped well 18, a first heavily-doped area 20, a second heavily-doped area 22, a second lightly-doped region 24, a second doped well 26, a third heavily-doped area 28, and a fourth heavily-doped area 30. The lightly-doped semiconductor structure 14 has a first conductivity type. The first lightly-doped region 16 has a second conductivity type and is formed in the lightly-doped structure 14. The first doped well 18 has the second conductivity type and is formed in the first lightly-doped region 16, and a first part of the first lightly-doped region 16 is arranged under the first doped well 18. In the first embodiment, the first part of the first lightly-doped region 16 is used as a first lightly-doped buried area 32. The first heavily-doped area 20 has the first conductivity type and is formed in the first doped well 18. The fourth heavily-doped area 30 has the second conductivity type and is formed in the first doped well 18. The first heavily-doped area 20 and the fourth heavily-doped area 30 are coupled to a first pin. The second lightly-doped region 24 has the second conductivity type and is formed in the lightly-doped structure 14. The second doped well 26 has the second conductivity type and is formed in the second lightly-doped region 24, and a second part of the second lightly-doped region 24 is arranged under the second doped well 26. In the first embodiment, the second part of the second lightly-doped region 24 is used as a second lightly-doped buried area 34. The second heavily-doped area 22 has the second conductivity type and is formed in the second doped well 26. The third heavily-doped area 28 has the first conductivity type and is formed in the second doped well 26. The second heavily-doped area 22 and the third heavily-doped area 28 are coupled to a second pin.

The lightly-doped semiconductor structure 14 further comprises a lightly-doped substrate 36 and a lightly-doped epitaxial layer 38. The lightly-doped substrate 36 has the first conductivity type. The lightly-doped epitaxial layer 38 has the first conductivity type and is formed on the lightly-doped substrate 36. The first lightly-doped buried area 32 and the second lightly-doped buried area 34 are formed in the lightly-doped substrate 36, and the first doped well 18 and the second doped well 26 are formed in the lightly-doped epitaxial layer 38. Besides, the first conductivity type is a P type and the second conductivity type is an N type. Alternatively, the first conductivity type is an N type and the second conductivity type is a P type. When an electrostatic discharge (ESD) event occurs at the first pin, an ESD current flows through the first pin, the first heavily-doped area 20, the first doped well 18, the lightly-doped epitaxial layer 38, the second doped well 26, the second heavily-doped area 22, and the second pin. Besides, the first doped well 18 and the second doped well 26 reduce the resistance of the flowing path. When an electrostatic discharge (ESD) event occurs at the second pin, an ESD current flows through the second pin, the third heavily-doped area 28, the second doped well 26, the lightly-doped epitaxial layer 38, the first doped well 18, the fourth heavily-doped area 30, and the first pin. Besides, the first doped well 18 and the second doped well 26 reduce the resistance of the flowing path. Furthermore, due to the first lightly-doped buried area 32 and the second lightly-doped buried area 34, the junction capacitance among the first doped well 18, the second doped well 26, and the lightly-doped substrate 36 can be reduced such that the bidirectional silicon-controlled rectifier is applied to high-speed components.

Figure 3:
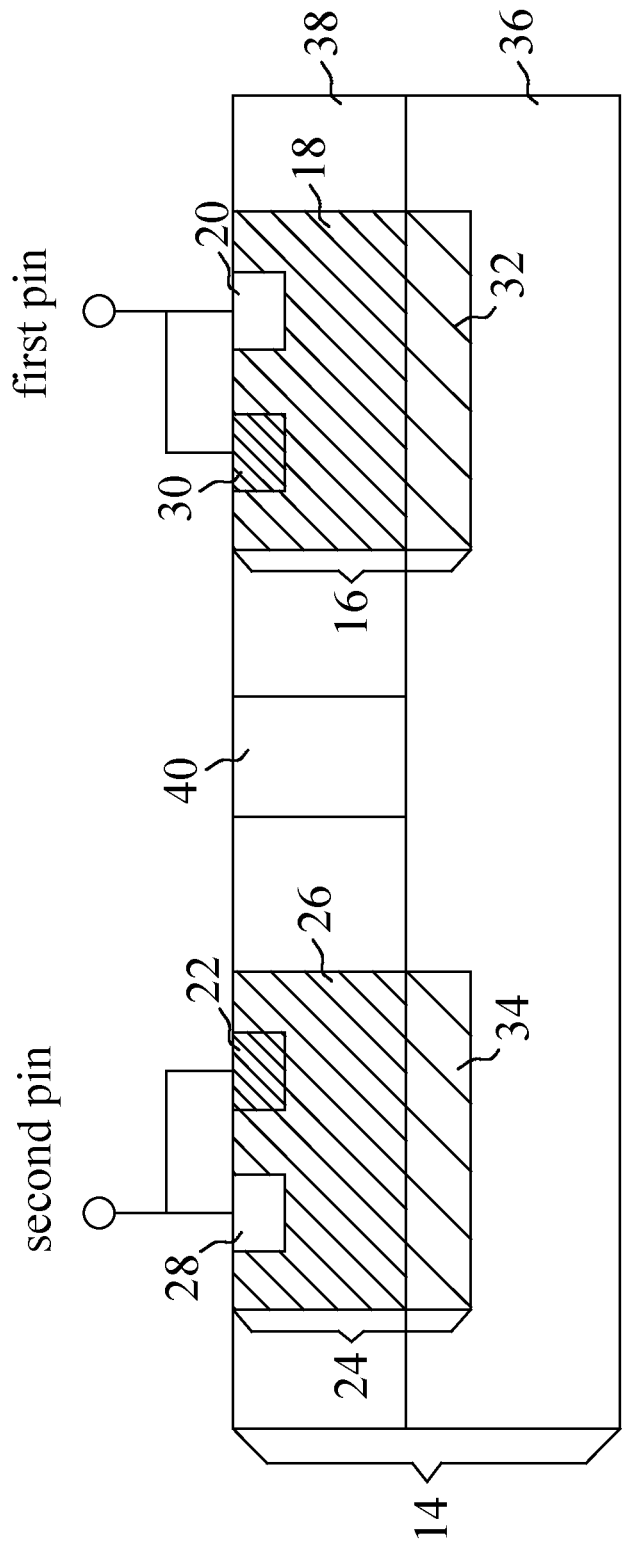
FIG. 3 is a cross-sectional view of a bidirectional silicon-controlled rectifier according to the second embodiment of the present invention.

Refer to FIG. 3. The second embodiment of the bidirectional silicon-controlled rectifier of the present invention is introduced as follows. The second embodiment is different from the first embodiment in that the second embodiment further comprises a third doped well 40 having the first conductivity type and formed in the lightly-doped epitaxial layer 38, and the depth of the third doped well 40 is equal to or deeper than the depths of the first heavily-doped area 20, the second heavily-doped area 22, the third heavily-doped area 28, and the fourth heavily-doped area 30. Preferably, the third doped well 40 contacts the lightly-doped substrate 36. When an electrostatic discharge (ESD) event occurs at the first pin, an ESD current flows through the first pin, the first heavily-doped area 20, the first doped well 18, the lightly-doped epitaxial layer 38, the third doped well 40, the second doped well 26, the second heavily-doped area 22, and the second pin. The first doped well 18, the second doped well 26, and the third doped well 40 can reduce the resistance of this flowing path. When an electrostatic discharge (ESD) event occurs at the second pin, an ESD current flows through the second pin, the third heavily-doped area 28, the second doped well 26, the lightly-doped epitaxial layer 38, the third doped well 40, the first doped well 18, the fourth heavily-doped area 30, and the first pin. The first doped well 18, the second doped well 26, and the third doped well 40 can reduce the resistance of this flowing path. Furthermore, due to the first lightly-doped buried area 32 and the second lightly-doped buried area 34, the junction capacitance among the first doped well 18, the second doped well 26, and the lightly-doped substrate 36 can be reduced such that the bidirectional silicon-controlled rectifier is applied to high-speed components.

Figure 4:
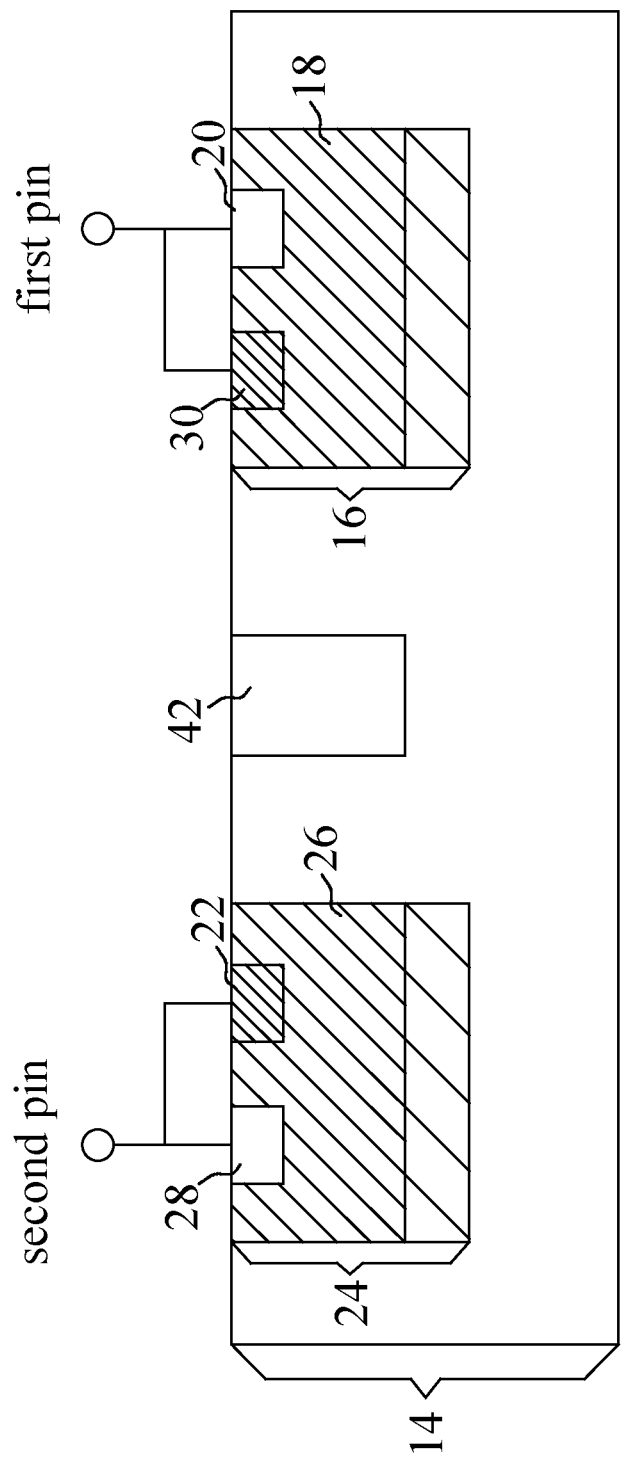
FIG. 4 is a cross-sectional view of a bidirectional silicon-controlled rectifier according to the third embodiment of the present invention.

Refer to FIG. 4. The third embodiment of the bidirectional silicon-controlled rectifier of the present invention is introduced as follows. The third embodiment is symmetrical. The bidirectional silicon-controlled rectifier comprises a lightly-doped semiconductor structure 14, a first lightly-doped region 16, a first doped well 18, a first heavily-doped area 20, a second heavily-doped area 22, a second lightly-doped region 24, a second doped well 26, a third heavily-doped area 28, a fourth heavily-doped area 30, and a third doped well 42. The lightly-doped semiconductor structure 14 has a first conductivity type. The first lightly-doped region 16 has a second conductivity type and is formed in the lightly-doped structure 14. The first doped well 18 has the second conductivity type and is formed in the first lightly-doped region 16, and a first part of the first lightly-doped region 16 is arranged under the first doped well 18. The first heavily-doped area 20 has the first conductivity type and is formed in the first doped well 18. The fourth heavily-doped area 30 has the second conductivity type and is formed in the first doped well 18. The first heavily-doped area 20 and the fourth heavily-doped area 30 are coupled to a first pin. The second lightly-doped region 24 has the second conductivity type and is formed in the lightly-doped structure 14. The second doped well 26 has the second conductivity type and is formed in the second lightly-doped region 24, and a second part of the second lightly-doped region 24 is arranged under the second doped well 26. In the third embodiment, the lightly-doped semiconductor structure 14 is a lightly-doped semiconductor substrate, and the first lightly-doped region 16 and the second lightly-doped region 24 are lightly-doped wells. The second heavily-doped area 22 has the second conductivity type and is formed in the second doped well 26. The third heavily-doped area 28 has the first conductivity type and is formed in the second doped well 26. The second heavily-doped area 22 and the third heavily-doped area 28 are coupled to a second pin. The third doped well 42 has the first conductivity type and is formed in the lightly-doped semiconductor substrate. The depth of the third doped well 42 is equal to or deeper than the depths of the first heavily-doped area 20, the second heavily-doped area 22, the third heavily-doped area 28, and the fourth heavily-doped area 30. Preferably, the depth of the third doped well 42 is equal to the depth of each of the first doped well 18 and the second doped well 26. Besides, the first conductivity type is a P type and the second conductivity type is an N type. Alternatively, the first conductivity type is an N type and the second conductivity type is a P type.

When an electrostatic discharge (ESD) event occurs at the first pin, an ESD current flows through the first pin, the first heavily-doped area 20, the first doped well 18, the lightly-doped semiconductor structure 14, the third doped well 42, the second doped well 26, the second heavily-doped area 22, and the second pin. Besides, the third doped well 42, the first doped well 18, and the second doped well 26 reduce the resistance of the flowing path. When an electrostatic discharge (ESD) event occurs at the second pin, an ESD current flows through the second pin, the third heavily-doped area 28, the second doped well 26, the lightly-doped semiconductor structure 14, the third doped well 42, the first doped well 18, the fourth heavily-doped area 30, and the first pin. Besides, the third doped well 42, the first doped well 18, and the second doped well 26 reduce the resistance of the flowing path. Furthermore, due to the first lightly-doped region 16 and the second lightly-doped region 24, the junction capacitance among the first doped well 18, the second doped well 26, and the lightly-doped semiconductor structure 14 can be reduced such that the bidirectional silicon-controlled rectifier is applied to high-speed components.

Figure 5:
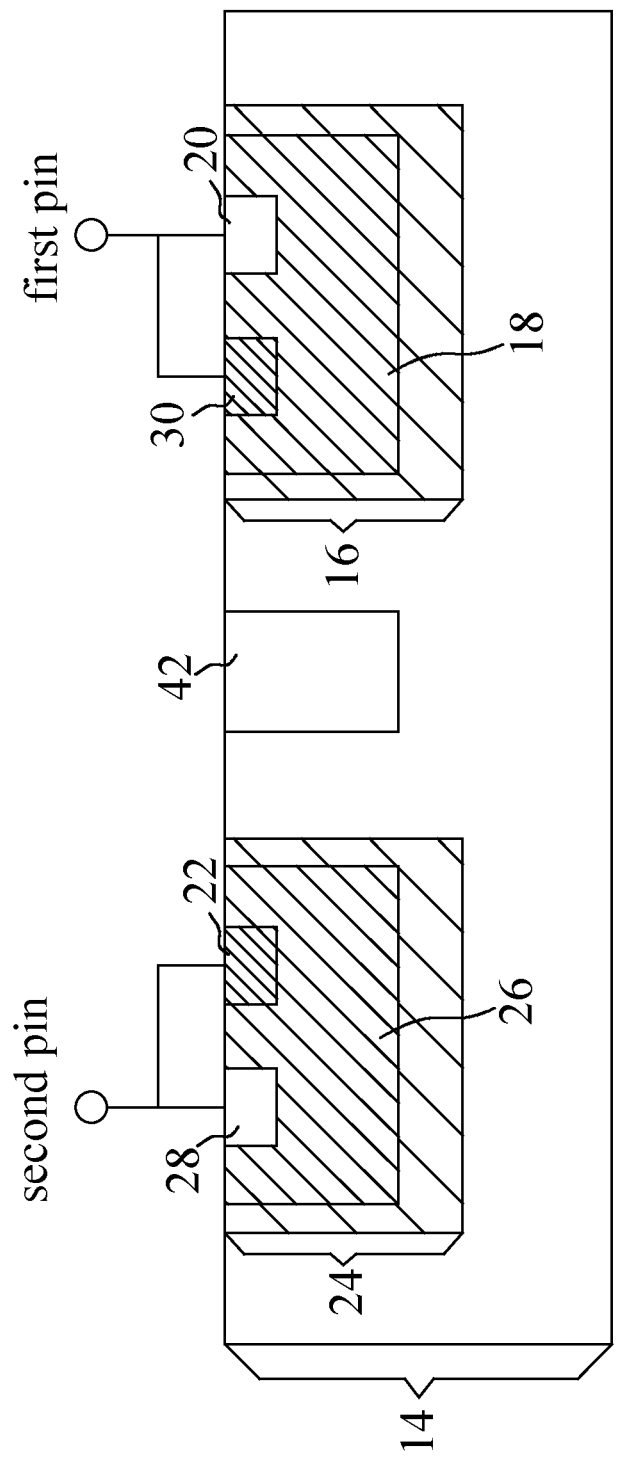
FIG. 5 is a cross-sectional view of a bidirectional silicon-controlled rectifier according to the fourth embodiment of the present invention.

Refer to FIG. 5. The fourth embodiment of the bidirectional silicon-controlled rectifier of the present invention is introduced as follows. The fourth embodiment is different from the third embodiment in the first lightly-doped region 16 and the second lightly-doped region 24. In the fourth embodiment, the first lightly-doped region 16 surrounds the first doped well 18 and the second lightly-doped region 24 surrounds the second doped well 26, whereby the junction capacitance between the second doped well 26 and the lightly-doped structure 14 and the junction capacitance between the first doped well 18 and the lightly-doped structure 14 are greatly reduced. The operation of the fourth embodiment is the same to that of the third embodiment so will not be reiterated.

In conclusion, the present invention forms the lightly-doped region under the doped well to reduce a junction capacitance, thereby applying to high-speed components.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A bidirectional silicon-controlled rectifier comprising:
    a lightly-doped semiconductor structure having a first conductivity type;
    a first lightly-doped region and a second lightly-doped region having a second conductivity type are formed in the lightly-doped semiconductor structure;
    a first doped well having the second conductivity type is formed in the first lightly-doped region, and a first part of the first lightly-doped region is arranged under the first doped well;
    a second doped well having the second conductivity type is formed in the second lightly-doped region, and a second part of the second lightly-doped region is arranged under the second doped well;
    a first heavily-doped area having the first conductivity type is formed in the first doped well;
    a second heavily-doped area having the second conductivity type is formed in the second doped well;
    a third heavily-doped area having the first conductivity type is formed in the second doped well; and
    a fourth heavily-doped area having the second conductivity type is formed in the first doped well.

2. The bidirectional silicon-controlled rectifier according to claim 1, wherein the first heavily-doped area and the fourth heavily-doped area are coupled to a first pin, and the second heavily-doped area and the third heavily-doped area are coupled to a second pin.

3. The bidirectional silicon-controlled rectifier according to claim 1, wherein the first part of the first lightly-doped region and the second part of the second lightly-doped region are respectively used as a first lightly-doped buried area and a second lightly-doped buried area.

4. The bidirectional silicon-controlled rectifier according to claim 3, wherein the lightly-doped semiconductor structure further comprises:
   a lightly-doped substrate having the first conductivity type; and
   a lightly-doped epitaxial layer having the first conductivity type and formed on the lightly-doped substrate, the first lightly-doped buried area and the second lightly-doped buried area are formed in the lightly-doped substrate, and the first doped well and the second doped well are formed in the lightly-doped epitaxial layer.

5. The bidirectional silicon-controlled rectifier according to claim 4, further comprising a third doped well having the first conductivity type and formed in the lightly-doped epitaxial layer, and a depth of the third doped well is equal to or deeper than depths of the first heavily-doped area, the second heavily-doped area, the third heavily-doped area, and the fourth heavily-doped area.

6. The bidirectional silicon-controlled rectifier according to claim 5, wherein the third doped well contacts the lightly-doped substrate.

7. The bidirectional silicon-controlled rectifier according to claim 1, wherein the lightly-doped semiconductor structure is a lightly-doped semiconductor substrate, and the first lightly-doped region and the second lightly-doped region are lightly-doped wells.

8. The bidirectional silicon-controlled rectifier according to claim 7, wherein the first lightly-doped region surrounds the first doped well and the second lightly-doped region surrounds the second doped well.

9. The bidirectional silicon-controlled rectifier according to claim 7, further comprising a third doped well having the first conductivity type and formed in the lightly-doped substrate, and a depth of the third doped well is equal to or deeper than depths of the first heavily-doped area, the second heavily-doped area, the third heavily-doped area, and the fourth heavily-doped area.

10. The bidirectional silicon-controlled rectifier according to claim 9, wherein a depth of the third doped well is equal to a depth of each of the first doped well and the second doped well.

11. The bidirectional silicon-controlled rectifier according to claim 1, wherein the first conductivity type is a P type and the second conductivity type is an N type.

12. The bidirectional silicon-controlled rectifier according to claim 1, wherein the first conductivity type is an N type and the second conductivity type is a P type.

* * * * *